United States Patent [19]

Moody et al.

[11] Patent Number: 5,331,218
[45] Date of Patent: * Jul. 19, 1994

[54] SWITCHED-CAPACITOR NOTCH FILTER WITH PROGRAMMABLE NOTCH WIDTH AND DEPTH

[75] Inventors: Kristaan L. Moody, Nottingham; Paul W. Latham, II, Lee, both of N.H.

[73] Assignee: Allegro Microsystems, Inc., Worcester, Mass.

[*] Notice: The portion of the term of this patent subsequent to Sep. 14, 2010 has been disclaimed.

[21] Appl. No.: 912,382

[22] Filed: Jul. 13, 1992

[51] Int. Cl.⁵ .............................................. H03K 5/00
[52] U.S. Cl. ..................................... 307/521; 328/167
[58] Field of Search ....................... 307/520, 521, 524; 328/167

[56] References Cited

U.S. PATENT DOCUMENTS

| | | | |
|---|---|---|---|
| 4,551,683 | 11/1985 | Matsuo et al. | 307/520 |
| 4,785,253 | 11/1988 | Hughes | 328/167 |
| 4,849,662 | 7/1989 | Holberg et al. | 307/520 |
| 4,857,778 | 8/1989 | Hague | 307/521 |
| 4,866,779 | 9/1989 | Kennedy et al. | 381/94 |
| 4,939,473 | 7/1990 | Eno | 328/167 |
| 4,954,785 | 9/1990 | Segaram | 328/167 |

OTHER PUBLICATIONS

Operational Amplifiers, G. E. Toby et al, (McGraw Hill), 1971, pp. 335-341.
Bipolar and MOS Integrated Circuit Design, Alan B. Grebene, (John Wiley and Sons), 1984, pp. 703-739.
Special Purpose Linear Devices Databook, National Semiconductor, 1989, pp. 4-15 through 4-35.

*Primary Examiner*—Richard A. Bertsch
*Assistant Examiner*—David W. Scheuermann

[57] ABSTRACT

A notch filter circuit includes first and second operational amplifiers, each having a capacitor connected from the amplifier output to the input. A third capacitor is connected between the second-amplifier input and the filter circuit input. A first switched-capacitor resistor is connected between the filter circuit input and the first-amplifier input. A second switched-capacitor resistor is connected between the first amplifier output and the second amplifier input. The second-amplifier output is connected to the filter circuit output. A third switched-capacitor resistor is connected between said filter circuit output and said first amplifier input; First and second programmable capacitor arrays are connected respectively in parallel with the third switched-capacitor resistor and in parallel with the first switched-capacitor resistor, so that a change only in the capacitance of the second capacitor array causes a corresponding change in the filter notch depth and a change only in the capacitance of the first capacitor array causes a corresponding change in the filter notch width. The first and second capacitor arrays each have a group of digital programming terminals that may be connected together for making fixed the ratio of the capacitance values of the two arrays. A digitally programmable voltage divider circuit connected in series with the second programmable capacitor array permits the independent programing of notch depth, i.e. without affecting notch width.

5 Claims, 3 Drawing Sheets

SWITCHED-CAPACITOR NOTCH FILTER WITH PROGRAMMABLE NOTCH WIDTH AND DEPTH

BACKGROUND

This invention relates to an active notch filter circuit employing switched-capacitor resistors and more particularly to such filter circuits that include simultaneously-digitally-programmable capacitor arrays for controlling notch width and notch depth.

Notch filters are used in analog-signal manipulating circuits for rejecting a particular signal frequency, or narrow range of frequencies. Conventional notch filters have a center or primary rejection frequency w, and a quality factor Q, which when high corresponds to a narrow filter bandwidth and when low corresponds to a relatively wide bandwidth. A high and low Q value also corresponds respectively to a narrow notch and a wide notch, as is further explained below. The transfer function of the conventional notch filter is expressed as $$\frac{V_{out}}{V_{in}} = \frac{S^2 + w^2}{S^2 + \frac{w}{Q} S + w^2}.$$

Notch filters of this kind are described by Alan B. Grebene in his book Bipolar And MOS Analog Integrated Circuit Design, 1984, pages 736-739.

Notch width and notch depth are typically established by the filter manufacturer and are not controllable by the filter user.

It is an object of this invention to provide a notch filter circuit that is programmable with respect to notch width and depth.

It is a further object of this invention to provide such a filter wherein notch width and notch depth are independently programmable by the user.

SUMMARY OF THE INVENTION

A programmable notch filter includes first and second tandem connected operational amplifiers, each with a capacitor connected output to input across it. The tandem connection is effected by one switched-capacitor resistor between the output of the first amplifier to the input of the second. Another switched-capacitor resistor is connected between the notch filter input and the input of the first amplifier. The filter output is the output of the second amplifier. Yet another switched capacitor resistor is connected between the notch filter output and the input of the first amplifier. A feed forward capacitor is connected between the input of the notch filter and the input of the second amplifier.

A notch-width programming circuit consists of a circuit branch, that includes a first digitally-programmable capacitor array, which array has a first group of digital programming terminals and which array is connected in parallel with the yet another switched-capacitor resistor for determining the capacitance of the first array, and thus the notch width, in response to a digital programming signal that may be applied to the first group of digital programming terminals.

A notch-depth programming circuit consists of a circuit branch, that includes a second digitally-programmable capacitor array, which array has a second group of digital programming terminals and which array is connected in parallel with the another switched-capacitor resistor. This second digitally-programmable capacitor array is for determining notch depth, in response to a digital programming signal that may be applied to the second group of digital programming terminals.

In another aspect of this invention, the first and second groups of digital terminals of the capacitor arrays are connected to each other; and a digitally programmable voltage divider circuit, has a third group of digital programming terminals, is connected in the notch-depth circuit branch, has an input connected to the notch filter input, and has an output connected to the second capacitor array for determining the divider ratio of the programmable voltage divider and thus the notch depth without affecting the notch width, in response to a digital programming signal that may be applied to the third group of digital programming terminals.

DESCRIPTION OF THE PREFERRED EMBODIMENTS

Figure 1:
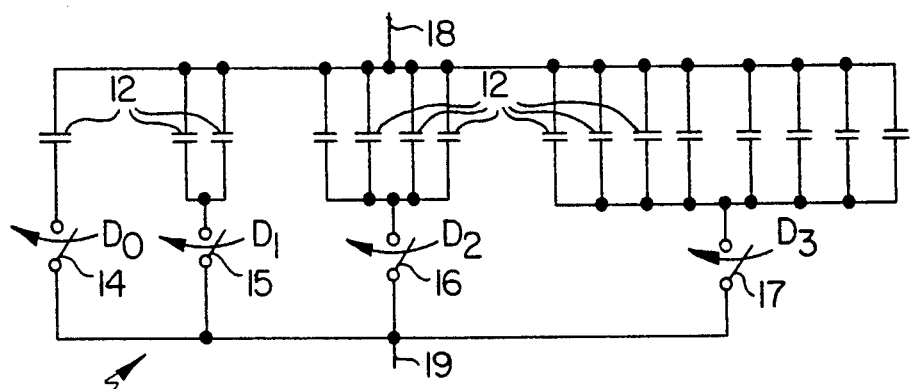
FIG. 1 shows a circuit diagram of a digitally programmable capacitor array suitable for use in a notch filter circuit of this invention.

A digitally programmable capacitor array 10 in FIG. 1 is binary weighted, i.e. all of the capacitors 12 have the same capacitance value, C, and they are connected in binary groups of 1, 2, 4, etc. Electrically programmable switches 14, 15, 16 and 17 determine which groups of capacitors 12 contribute to the capacitance $C_A$ of the array 10 as measured between terminals 18 and 19.

The digital-signal-activated switches 14, 15, 16 and 17 are preferably implemented as MOS transistors (not shown). A switch to which a binary zero is applied opens, and a switch to which a binary 1 is applied closes to connect the switch-associated group of capacitors 12 between terminals 18 and terminal 19. Thus for example, when the digital programming signal is 1/0/0/1, only switches 14 and 17 contribute to the array capacitance $C_A$ which is illustrated in the block diagram of FIG. 2. The corresponding decimal number is $N = D0 + 2D1 + 4D2 + 8D3 = 1 \cdot 1 + 2 \cdot 0 + 4 \cdot 0 + 8 \cdot 1 = 9$.

Thus $C_A = (D0 + 2D1 + 4D2 + 8D3)C$, or $C_A = MC$, wherein M is the decimal number corresponding to the digital programming signal that sets the switches 14 through 17.

For greater simplicity and clarity of presentation, the number of programming bits shown in the drawing, m, is just 4 whereas a greater number of bits will usually be preferred. M can be any integer between 0 and $2^m-1$. Thus for m=4, M can be any integer between 0 and 15.

Figure 2:
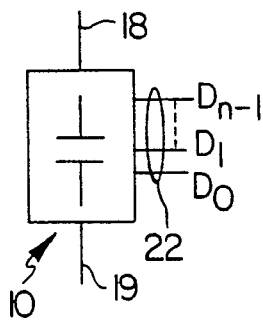
FIG. 2 shows a block-diagram representation of the capacitor array of FIG. 1.

The programmable capacitor array of FIG. 1 may be more simply represented by symbol 10 of FIG. 2. The programmable-array capacitance is $C_A$. The capacitor array 20 has capacitance terminals 18 and 19, and has a group of digital programming terminals 22 to which the programming digital signal is to be applied.

Figure 3:
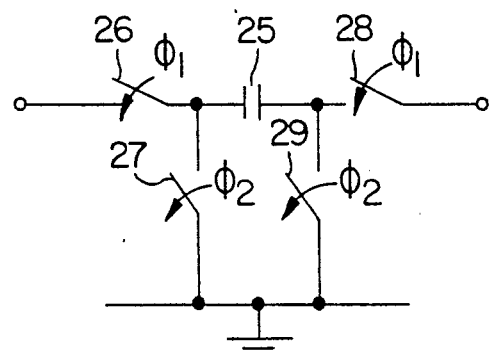
FIG. 3 shows a circuit diagram of a switched capacitor resistor.

The switched-capacitor resistor circuit of FIG. 3 simulates a resistor whose equivalent ohmic value is $$R_s = 1/f_c C_s$$

where $C_s$ is the capacitance of switched capacitor 25. The two phases $\phi_1$ and $\phi_2$ of a two phase clock signal of frequency $f_c$ are applied as indicated in FIG. 3 to the clocked switches 26, 27, 28 and 29. With the four switches clocked as shown in FIG. 3, the resistor is said to be a positive switched capacitor resistor. As is well known, a negative switched capacitor resistor is formed in the case that switches 28 and 29 are changed to be clocked respectively by clock phases $\phi_2$ and $\phi_1$ so that a positive input charge (signal) generates a negative output charge (signal).

Figure 4:
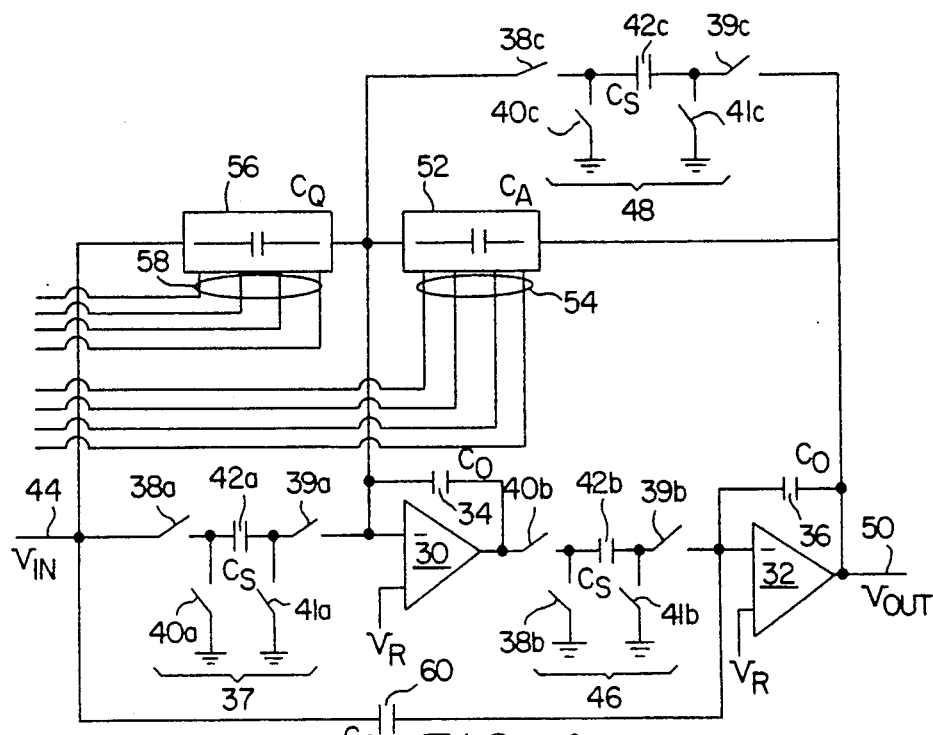
FIG. 4 shows a first preferred embodiment of a notch filter circuit of this invention.

Referring now to FIG. 4, operational amplifiers 30 and 32 have integrating capacitors 34 and 36, respectively, connected between each amplifiers's negative input and output. A first and positive switched-capacitor resistor circuit 37 is comprised of switches 38a, 39a, 40a and 41a and capacitor 42a. Resistor 37 is connected between the filter input conductor 44 and the negative input of the amplifier 30. A second but negative switched-capacitor resistor 46 is comprised of switches 38b, 39b, 40b and 41b and capacitor 42b. Resistor 46 is connected between the output of the amplifier 30 and the negative input of the second amplifier 32.

A third and positive switched-capacitor resistor 48 is comprised of switches 38c, 39c, 40c and 41c and capacitor 42c. Resistor 48 is connected between the output of the amplifier 32, that corresponds to the filter output conductor 50, and the negative input of the first amplifier 32. A first programmable capacitor array 52, of capacitance $C_A$, having a group of digital programming input terminals 54, is connected between the filter output conductor 50 and the negative input of amplifier 30. A programmable capacitor array 56, of capacitance $C_Q$, having a group of digital programming input terminals 58, is connected in parallel with the switched capacitor 37. A feedforward capacitor 60 is connected between the filter input conductor 44 and the negative input of the second amplifier 32.

Although not essential to the invention, the values of switching capacitors 42a, 42b and 42c are preferably of the same integrated circuit structure, e.g. MOS, and preferably the same size and therefore the having the same value $C_s$ for optimum capacitance matching at manufacture. This also makes simpler the analysis of the circuit. For the same reason, the value of the capacitors 34, 36 and 60 are preferably set equal, to value Co.

Figure 5:
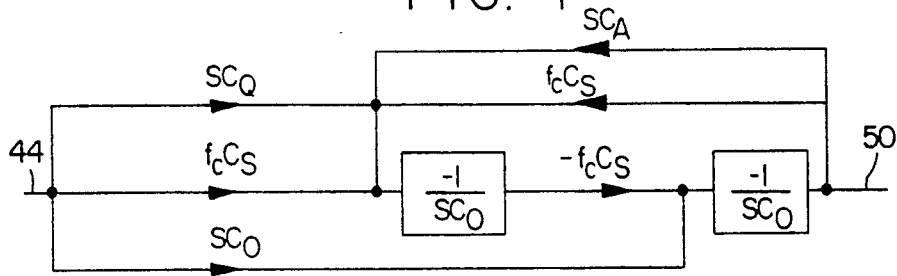
FIG. 5 shows a current flow diagram corresponding to the circuit of FIG. 4.

The current flow diagram of FIG. 5 assigns a reciprocal impedance expression to each branch of the notch filter circuit of FIG. 5, which expression when multiplied by the branch voltage drops across the branch components equals the branch current. This diagram represents a conventional method for analysis of a complex circuit, in this instance leading to the notch circuit transfer function:

$$\frac{V_{out}}{V_{in}} = \frac{S^2 + \frac{C_A}{C_o} f_c \frac{C_s}{C_o} S + (f_c)^2 \frac{(C_s)^2}{(C_o)^2}}{S^2 + \frac{C_Q}{C_o} f_c \frac{C_s}{C_o} S + (f_c)^2 \frac{(C_s)^2}{(C_o)^2}}$$

The form of this transfer function illuminates a major advantage of this notch filter, namely that the center (notch) frequency w is exclusively determined by the predictable temperature stable capacitor ratio Cs/Co and the switching frequency $f_c$ of the switched capacitor resistors which can be made as stable as desired by the user; and the quality factor Q, which determines the width of the filter notch in the transfer function, is exclusively determined by the capacitor ratio Co/$C_Q$. Furthermore, it is also preferred to fabricate the fixed capacitances Co from one or more of the elemental MOS capacitors that make up the binarily weighted capacitor arrays so that for any digitally programmed values of the array capacitances $C_A$ and $C_Q$ the ratios $C_A/C_Q$, that controls notch depth, and the ratio Co/$C_Q$ are equally predictable and stable. These key capacitance ratios are $$w = f_c \frac{C_s}{C_o}, \ Q = \frac{C_o}{C_Q} \ \text{and} \ @ = \frac{C_A}{C_Q}.$$

The above-noted advantages derive partly from the use of switched capacitor resistors leading to key capacitance ratio parameters in the transfer function.

The notch filter transfer function above for the circuit of FIG. 4 can now be rewritten as $$\frac{V_{out}}{V_{in}} = \frac{S^2 + @\frac{w}{Q} S + w^2}{S^2 + \frac{w}{Q} S + w^2}.$$

This equation for the filter of FIG. 4 is comparable to the transfer function for a conventional notch filter described above on page 1, except for having the new S-term in the numerator. The transfer function of the notch filter of FIG. 4 is seen to permit changing the center frequency w, the Q or notch width, and the notch depth @ by changing capacitance ratios. The array capacitances $C_A$ and $C_Q$ are digitally programmable making this feasible. The center frequency w can be adjusted by adjusting $f_c$.

However, a change in Q being effected by reprogramming the value of array capacitance $C_Q$ also changes notch depth @. But @ can be held constant by also adjusting $C_A$. In order to achieve complete independence of adjustment for each of these three performance characteristics, there is added in the notch filter circuit of FIG. 6 a programmable voltage divider 64, having a group 82 of digital programming input terminals, in series with the array capacitor 56.

Figure 7:
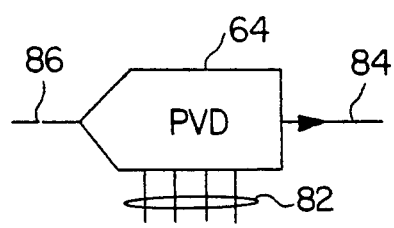
FIG. 7 shows a block diagram of a reverse-connected DAC for use as a digitally controlled voltage divider.

Digitally programmable voltage divider (PVD) circuits may be obtained by using standard digital-to-analog circuits (DAC's) in a voltage mode. A conventional block symbol representing a standard DAC is converted to a PVD 64 by the addition of an arrow at the PVD output 84 as shown in FIG. 7, with multiple input terminals becoming a group of digital programming PVD terminals 82 for parallel application thereto of a digital programming signal. The DAC may be operated as PVD 64 by applying at the DAC voltage-reference terminal, now the PVD input terminal 86, an analog signal to be attenuated and observing the resulting analog signal at the DAC output terminal, now the PVD output terminal 84. The amount of attenuation, A, obtained is determined by the particular digital signal that is being applied to the group of DAC digital input terminals, now PVD digital programming terminals 82.

Filed concurrently herewith is applicant's application entitled DIGITALLY DUAL-PROGRAMMABLE INTEGRATOR CIRCUIT, which describes in more detail programmable capacitor arrays and such reverse connected DACs used as voltage dividers; and that co-filed application is incorporated by reference herein.

The effect of the PVD 64 is to reduce the capacitance $C_A$ of the array capacitor 56 by the amount of the PVD attenuation ratio A.

However, it can be seen from an above-given transfer equation of the circuit of FIG. 4, that in a special case wherein the same digital programming signal is applied to both capacitor-array programming terminals 54 and 58 connected in parallel, the ratio of the capacitance values of the first and second arrays will remain constant for all digital programming input signals that may be applied to the connected together terminals. This special case exists for the circuit of FIG. 6.

Figure 6:
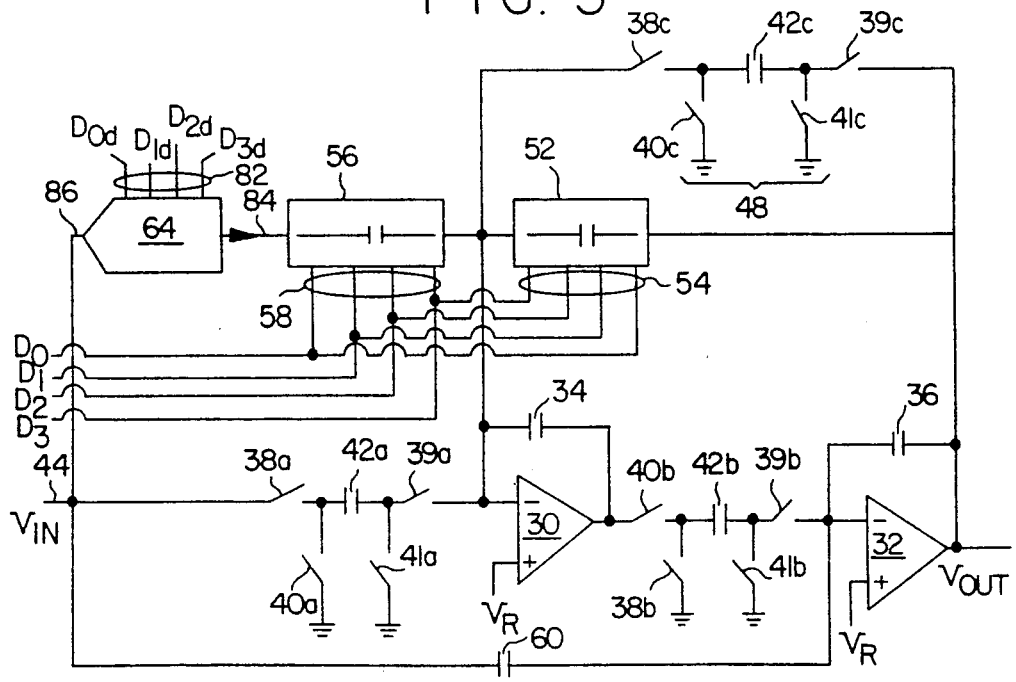
FIG. 6 shows a second preferred embodiment of a notch filter circuit of this invention.

The array capacitors 56 and 52 of FIG. 6 are preferably identical for optimizing capacitance matching and have their programming terminals 58 and 54 connected in parallel so that both are simultaneously changed by the digital programming signal and always have identical values, i.e. $C_Q = C_A$, and In the circuit of FIG. 4, the notch setting parameter @ $= C_A/C_Q$, but in the circuit of FIG. 6 the notch-depth-setting capacitance is $AC_A$, where A is the PVD attenuation. The new notch-depth-setting parameter is $$@_1 = \frac{AC_A}{C_Q} = \frac{AC_A}{C_A} = A.$$

The transfer function for the notch circuit of FIG. 7 is now $$\frac{V_{out}}{V_{in}} = \frac{S^2 + A\frac{C_A}{C_o}f_c\frac{C_S}{C_o}S + (f_c)^2\frac{(C_S)^2}{(C_o)^2}}{S^2 + \frac{C_Q}{C_o}f_c\frac{C_S}{C_o}S + (f_c)^2\frac{(C_S)^2}{(C_o)^2}}.$$

This transfer function indicates that notch width is programmable by $C_Q$, and notch depth is programmable by A; and notch width and depth are now independently programmable.

Performance of this circuit is demonstrated as follows for the notch filter circuit constructed as shown in FIG. 6.

Figure 8:
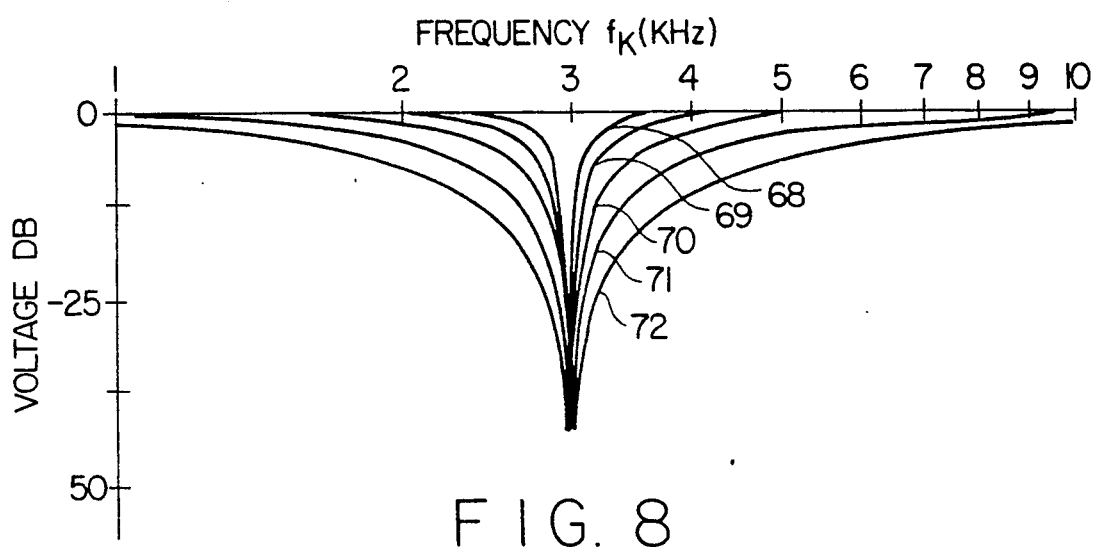
FIG. 8 shows, for different values of the programmable capacitance ratio $C_0/C_Q$, plots of the transfer function Vout/Vin, or "gain", as a function of the frequency $f_k$ of the input signal, for the circuit of FIG. 5.

In FIG. 8, the notch filter gain curves 68, 69, 70, 71 and 72 are plotted as a function of input signal frequency $f_k$, each corresponding respectively to five different digital signals of decimal value M applied to the capacitor arrays 52 and 56. The resulting curves and values of Q, namely $C_o/C_Q$, are given in Table I.

TABLE I

| M | Q | curve # |
|---|---|---------|
| 1 | 8 | 68 |
| 2 | 4 | 69 |
| 4 | 2 | 70 |
| 8 | 1 | 71 |

TABLE I-continued

| M | Q | curve # |
|---|---|---------|
| 16 | .5 | 72 |

Figure 9:
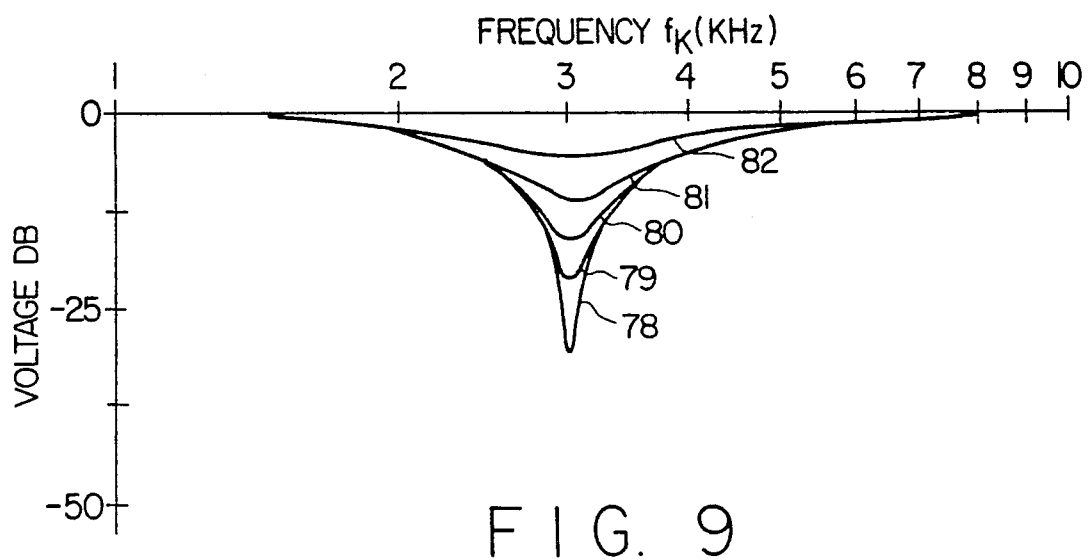
FIG. 9 shows, for different values of the programmable voltage divider ratio, A, a plot of the transfer function Vout/Vin, or "gain", as a function of the frequency $f_k$ of the input signal, for the circuit of FIG. 5.

In FIG. 9, the notch filter gain curves 78, 79, 80, 81 and 82 are plotted as a function of input signal frequency $f_k$, and each corresponding respectively to five different digital signals of decimal value N applied to the programmable voltage divider 64. The resulting curves and values of attenuation A are given in Table II.

TABLE II

| N | A | curve # |
|---|---|---------|
| 1 | 1/16 | 78 |
| 2 | 1/8 | 79 |
| 4 | 1/4 | 80 |
| 8 | 1/2 | 81 |
| 16 | 1 | 82 |

The notch width seen in FIG. 9 does not change as notch depth is programmably varied, and the notch depth in FIG. 8 does not change as notch width is programmably varied. Thus complete independence in the programming of these performance characteristics is realized.

The programmable state-variable notch filter circuit of this invention is especially well suited as one of the analog-signal manipulating circuits employed in the integrated circuit co-processor described in the patent application filed simultaneously herewith entitled HYBRID CONTROL-LAW SERVO CO-PROCESSOR INTEGRATED CIRCUIT, of the same inventive entity and assigned to the same assignee as is the present invention. Uses and additional advantages of this notch filter circuit are described in that co-filed application and that co-filed application is hereby incorporated by reference herein.

We claim:

1. A notch filter circuit comprising:
   a) a filter circuit input and a filter circuit output;
   b) first and second operational amplifiers;
   c) first and second capacitors connected respectively between the output and the negative input of each of said first and second amplifiers;
   d) a first switched-capacitor resistor connected between said filter circuit input and said first-amplifier input;
   e) a second switched-capacitor resistor connected between said first amplifier output and said second amplifier input, said second-amplifier output connected to said filter circuit output;
   f) a third switched-capacitor resistor connected between said filter circuit output and said first amplifier input;
   g) a first programmable capacitor array connected in parallel with said third switched-capacitor resistor;
   h) a third capacitor connected between said second-amplifier input and said filter circuit input, and
   i) a second programmable capacitor array connected in parallel with said first switched-capacitor resistor, so that a change only in the capacitance of said second capacitor array causes a corresponding change in the filter notch depth and a change only in the capacitance of said first capacitor array causes a corresponding change in the filter notch width.

2. The notch filter of claim 1 wherein said first, second and third capacitors have the same capacitance values so that the Q of said notch-filter is equal to the ratio of said same capacitance value and the capacitance value of said first capacitor array.

3. The notch filter of claim 1 wherein said first and second arrays are digitally programmable, said first and second capacitor arrays having a group of digital programming terminals, the groups of programming terminals of said first and second capacitor arrays connected to each other for making the ratio of the capacitance values of said first and second arrays constant for all digital programming input signals that may be applied to said connected together terminals.

4. The notch filter of claim 3 wherein said first and second capacitor arrays are essentially identical, for making the capacitance values of said first and second arrays equal for all digital programming input signals that may be applied to said connected together terminals.

5. The notch filter of claim 3 additionally comprising a digitally programmable voltage divider circuit connected in series with said second programmable capacitor array between said filter circuit input and said second capacitor array.

* * * * *